United States Patent
Gu et al.

(10) Patent No.: US 7,341,978 B2
(45) Date of Patent: Mar. 11, 2008

(54) SUPERCONDUCTOR WIRES FOR BACK END INTERCONNECTS

(75) Inventors: Shiqun Gu, Vancouver, WA (US); Wai Lo, Lake Oswego, OR (US); Hong Lin, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 340 days.

(21) Appl. No.: 11/072,158

(22) Filed: Mar. 4, 2005

(65) Prior Publication Data

US 2006/0197193 A1    Sep. 7, 2006

(51) Int. Cl.
*H01L 33/00*    (2006.01)
(52) U.S. Cl. .................................................. 505/330
(58) Field of Classification Search ............... 438/700, 438/709; 505/330
See application file for complete search history.

(56) References Cited

U.S. PATENT DOCUMENTS 6,312,874 B1 * 11/2001 Chan et al. .................. 430/314

* cited by examiner

*Primary Examiner*—Scott B. Geyer
*Assistant Examiner*—Elias Ullah
(74) *Attorney, Agent, or Firm*—Luedeka Neely & Graham, P.C.

(57) ABSTRACT

An improvement to an integrated circuit, of electrically conductive interconnects formed of a superconducting material. In this manner, the electrically conductive interconnects can be made very small, and yet still have adequate conductively. In various embodiments, all of the electrically conductive interconnects are formed of the superconducting material. In some embodiments, the electrically conductive interconnects are formed of a variety of different superconducting materials. In one embodiment, only the backend electrically conductive interconnects are formed of the superconducting material. In some embodiments no vias are formed of the superconducting material. The interconductor dielectric layers are preferably formed of silicon oxide, and sometimes all of the interconductor dielectric layers are formed of silicon oxide. The superconducting material is in some embodiments at least one of an organic compound such as a potassium doped buckminsterfullerene, a cesium doped buckminsterfullerene, and other carbon containing compounds, a metallic material such as an inter-metallic material like Nb—Ti alloys and other substances formed by alloying metals, and an inorganic compound such as $YBa_2Cu_3O_{7-x}$, $(Pb,Bi)_2Sr_2Ca_2Cu_3O_{10-x}$ and its derivatives, HgBaCaCuO and its derivatives, and Tl—Ba—Ca—Cu—O and its derivatives.

12 Claims, 2 Drawing Sheets

SUPERCONDUCTOR WIRES FOR BACK END INTERCONNECTS

FIELD

This invention relates to the field of integrated circuit fabrication. More particularly, this invention relates to improving the conductivity of electrically conductive elements within an integrated circuit as device geometries are made continually smaller.

BACKGROUND

For every succeeding generation of integrated circuits, both transistor speed and transistor density has increased. To increase the transistor density, the metal line widths, via diameters, and spacing for the electrical interconnects have been reduced. The reduction of metal line width and via diameter increases the electrical resistance of these structures, while reduction of the spacing increases the capacitance between the metal lines. These two factors combine to decrease the switching speed of the interconnect, thus reducing the frequency at which the integrated circuit can reliably operate. Therefore, the design goal of increasing the density of an integrated circuit tends to be odds with the design goal of increasing the speed of the integrated circuit.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Two methods have been investigated to overcome these competing design problems. The first is to replace the aluminum, that was traditionally used for the metal interconnects, with copper. Copper has a lower bulk resistivity than aluminum, and therefore is a better conductor. By making this replacement, smaller interconnects could be fashioned, having the same resistance as the older aluminum interconnects.

The second method is to replace the silicon oxide, that was traditionally used for the dielectric insulation between the metal interconnects, with a low k material. Low k materials have a lower dielectric constant than silicon oxide, and therefore a layer of a low k material induces less capacitance between adjacent metal lines than does a layer of silicon oxide. By making this replacement, smaller spacing between interconnects could be fashioned, having no more capacitance than the older silicon oxide dielectrics.

Unfortunately, these solutions have proven to be inadequate for a variety of reasons. For example, as device geometries continue to decrease, even copper, with its lower resistivity, is still too resistive for the desired new interconnect dimensions. Further, low k materials are notoriously fragile, and tend to not provide the structural strength required by the integrated circuit. This problem is made worse when the amount of low k material is reduced as the spacing between the electrically conductive interconnects is reduced.

What is needed, therefore, is a system that overcomes problems such as those described above, at least in part.

SUMMARY

The above and other needs are met by an improvement to an integrated circuit, of electrically conductive interconnects formed of a superconducting material. In this manner, the electrically conductive interconnects can be made very small, and yet still have adequate conductively. In various embodiments, all of the electrically conductive interconnects are formed of the superconducting material. In some embodiments, the electrically conductive interconnects are formed of a variety of different superconducting materials. In one embodiment, only the backend electrically conductive interconnects are formed of the superconducting material. In some embodiments no vias are formed of the superconducting material. The interconductor dielectric layers are preferably formed of silicon oxide, and sometimes all of the interconductor dielectric layers are formed of silicon oxide. The superconducting material is in some embodiments at least one of an organic compound such as a potassium doped buckminsterfullerene, a cesium doped buckminsterfullerene, and other carbon containing compounds, a metallic material such as an inter-metallic material like Nb—Ti alloys and other substances formed by alloying metals, and an inorganic compound such as $YBa_2Cu_3O_{7-x}$, $(Pb,Bi)_2Sr_2Ca_2Cu_3O_{10-x}$ and its derivatives, HgBaCaCuO and its derivatives, and Tl—Ba—Ca—Cu—O and its derivatives.

According to another aspect of the invention there is described a method of fabricating an integrated circuit. An interconductor dielectric layer is formed, and a trench is formed in the interconductor dielectric layer. An electrically conductive interconnect of a superconducting material is formed in at least a portion of the trench.

In various embodiments of this aspect of the invention, the improvement is applied to all interconductor dielectric layers. The interconductor dielectric layer is preferably formed of silicon oxide. The trench may be a dual damascene structure having a lower via hole portion and an upper trough portion, where both the via hole portion and the upper trough portion are filled with the superconducting material. Alternately, the via hole portion is filled with a metal that is not a superconducting material and the upper trough portion is filled with the superconducting material. The trench is preferably formed with a dry etch. Preferably, an etch stop layer is formed prior to forming the interconductor dielectric layer.

The electrically conductive interconnect is formed in various embodiments by laser ablation, sputtering, MOCVD, sol-gel, metal organic decomposition, doctor-blade, liquid phase epitaxy, and spin coating. In some embodiments a protective layer is formed over the superconducting interconnect, where the protective layer is formed of a material having a relatively high and selective wet etch rate in comparison to the interconductor dielectric layer. The superconducting material is preferably one that superconducts at a temperature above about seventy-seven degrees Kelvin. The superconducting material is in some embodiments at least one of an organic compound such as a potassium doped buckminsterfullerene, a cesium doped buckminsterfullerene, and other carbon containing compounds, a metallic material such as an inter-metallic material like Nb—Ti alloys and other substances formed by alloying metals, and an inorganic compound such as $YBa_2Cu_3O_{7-x}$, $(Pb,Bi)_2Sr_2Ca_2Cu_3O_{10-x}$ and its derivatives, HgBaCaCuO and its derivatives, and Tl—Ba—Ca—Cu—O and its derivatives.

According to another aspect of the invention there is described a method of fabricating an integrated circuit, by forming all interconductor dielectric layers of silicon oxide. A dual damascene trench is dry etched in the interconductor dielectric layers, including a lower via hole portion and an upper trough portion. A superconducting material is deposited in both the via hole portion and the trough portion of the trench, so as to completely fill the trench. The integrated circuit is chemically mechanically polished to remove any of the superconducting material that is outside of an upper surface of the trench.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
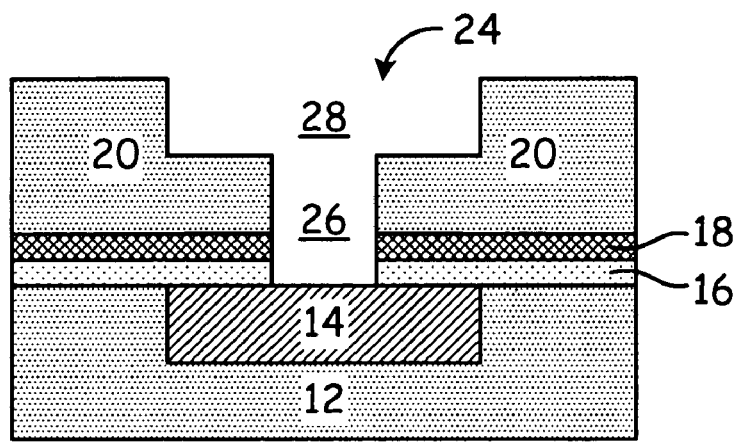
FIG. 1 is a cross sectional view of a portion of an integrated circuit depicting a trench for a via and an interconnect according to a preferred embodiment of the invention.

With reference now to FIG. 1, there is depicted a cross sectional view of a portion of an integrated circuit 10, with a trench 24 having a via portion 26 and an interconnect portion 28 according to a preferred embodiment of the invention. Element 14 in FIG. 1 represents an electrically conductive element to which an electrical connection is to be made. The element 14 may be a portion of a transistor, such as a gate, source, or drain, or a contact for such, or some other type of electrically conductive element, including a superconducting material as described herein. Element 12 is a non electrically conductive material that provides electrical isolation for the element 14.

Because of problems such as those described elsewhere herein, non electrically conductive interconductor layers, such as 12, 20, and 22, described in more detail hereafter, are being formed with increasing frequency of low k materials. However, in the preferred embodiments of the present invention, such non electrically conductive layers are formed of silicon oxide or other dielectric insulator such as silicon nitride and silicon carbide. Silicon oxide provides higher structural strength than low k materials, and thus provides more support for the integrated circuit 10 as the geometries of such structures decrease in size.

Disposed on top of the elements 12 and 14 are etch stop layers 16 and 18. The etch stop layers 16 and 18 are optional layers, but are present in the preferred embodiments of the invention. When layer 20 is silicon oxide, the etch stop layer 18 is preferably a traditional type of etch stop, such as is formed of a material like silicon carbide or silicon nitride, that provides a layer of a material that etches very slowly in regard to an overlying layer, so that when the overlying layer is etched, the etch stop layer provides a stop whereby portions of the overlying layer that are etching more slowly for some reason have time to completely etch, while those portions of the overlying layer that are etching more rapidly for some reason do not etch down too far into an underlying layer. In other words, the etch stop layer 18 provides for some amount of buffer so that all portions of an overlying layer can be properly etched, regardless of minor differences in the etch rate across the substrate.

The etch stop layer 16 provides a different function. Typically, etches are done with dry etching techniques. However, dry etching tends to be very detrimental to many of the superconducting layers described herein. Thus, etch stop layer 16 is preferably a layer of a material that has a very high wet etch rate and good selectively to other materials, such as the non electrically conductive layers of the integrated circuit 10, like layers 12, 20, and 22, which are described in more detail elsewhere herein. Thus, etch stop layer 16 is designed to be removed very quickly by a wet etch, while other layers that are exposed to the wet chemistry are not significantly impacted in the time that is required to remove the etch stop layer 16 in the via portion 26. Such a system would protect the element 14, in the case where the element 14 is formed of a superconducting material. Alternately, if layer 20 is silicon nitride or silicon carbide, then the etch stop layers 16 and 18 can be combined into one layer such as silicon oxide, where dry etching is stopped part way through the etch stop layer 16, and a wet etch is used to remove the remaining etch stop layer.

The trench 24 is preferably formed using a dual damascene technology, as is known in the art, where the via portion 26 and the trough portion 28, in which the interconnect will be formed, are both formed prior to filling the trench 24 with an electrically conductive material. However, in alternate embodiments of the invention, as described hereafter, a more traditional process can be used where the via portion 26 is formed and filled before the trough portion 28 is formed and filled. In either embodiment, the etch stop layers 16 and 18 are removed at the bottom of the via portion 26, prior to filling the trench 24 with the electrically conductive material for the vias and interconnects.

As mentioned above, dry etching techniques are the preferred methods for forming the trench 24 and removing the etch stop 18. However, a wet chemistry is preferably used for removing the etch stop 16, so as to not damage the superconducting materials that are preferably used for the interconnects, such as element 14, as described herein.

Figure 2:
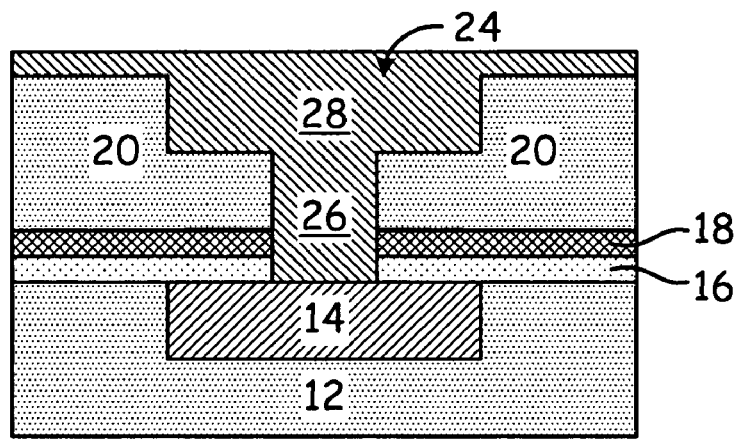
FIG. 2 is a cross sectional view of a portion of the integrated circuit of FIG. 1, where the trench has been filled with a superconducting material.

As depicted in FIG. 2, the trench 24 is filled with an electrically conductive material, which according to the present invention is a superconducting material. The superconducting material is in some embodiments at least one of an organic compound such as a potassium doped buckminsterfullerene, a cesium doped buckminsterfullerene, and other carbon containing compounds, a metallic material such as an inter-metallic material like Nb—Ti alloys and other substances formed by alloying metals, and an inorganic compound such as $YBa_2Cu_3O_{7-x}$, $(Pb,Bi)_2Sr_2Ca_2Cu_3O_{10-x}$ and its derivatives, HgBaCaCuO and its derivatives, and Tl—Ba—Ca—Cu—O and its derivatives.

Most preferably, the superconducting material is one of the so-called warm superconductors, which starts to exhibit superconducting properties at a temperature close to about 77 degrees Kelvin, which is the liquefaction temperature of nitrogen. Thus, any integrated circuit 10 formed using such materials would be operable at that temperature when cooled with liquid nitrogen. As standard semiconducting materials also exhibit good properties at that temperature, such superconducting materials are a good fit for integrated circuit fabrication. However, warmer critical temperature superconductors, and possibly some cooler critical temperature superconductors could also be used.

It is difficult to make bulk electrical wires such as those described herein out of ceramic high critical temperature materials, because of their brittleness. However, the superconducting material described herein can be deposited by a variety of techniques that work in the present embodiments, including laser ablation, sputtering, MOCVD, sol-gel, metal organic decomposition, doctor-blade, and liquid phase epitaxy. The orientation of the superconducting material can either be textured, using techniques such as ion-beam assisted orientation selection, or random. An anneal process may be used to treat the superconducting material to increase its critical temperature. The doped buckminsterfullerenes are preferably applied by spin coating, and the ceramic superconducting materials are preferably applied by plasma deposition.

Figure 3:
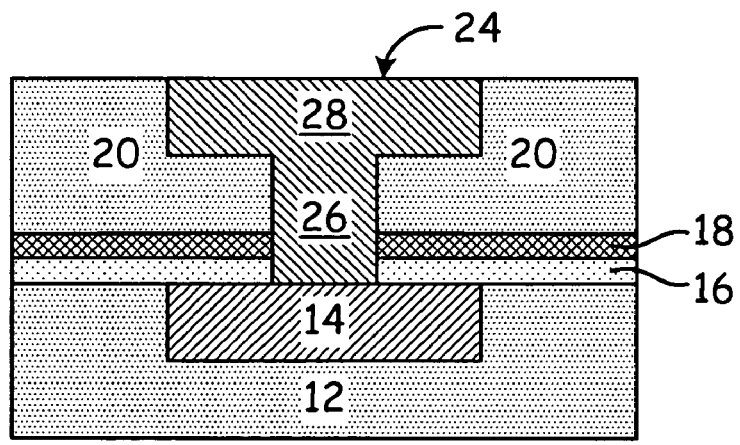
FIG. 3 is a cross sectional view of a portion of the integrated circuit of FIG. 2, where the excess superconducting material has been removed.
Figure 4:
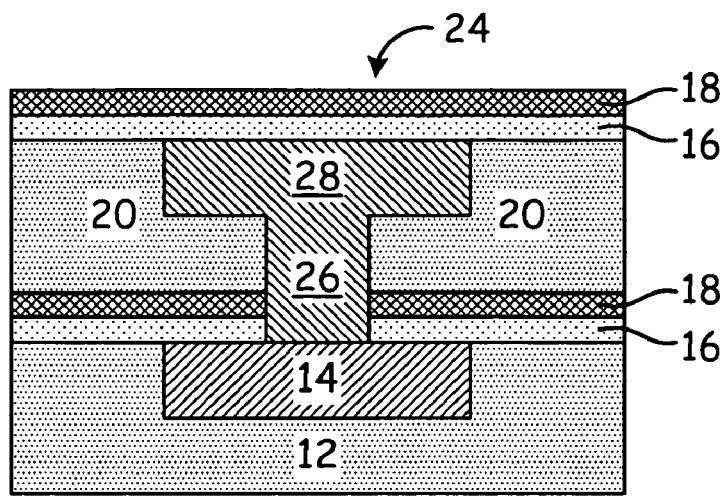
FIG. 4 is a cross sectional view of a portion of the integrated circuit of FIG. 3, where the superconducting material has been overlaid with a protective layer and an etch stop layer.

The trench 24 is preferably completely filled with the superconducting material. As depicted in FIG. 3, the superconducting material that overfills the trench 24 or is deposited outside of the trench 24 is preferably removed, such as by a chemical mechanical polishing process. Following planarization, the etch stop layers 16 and 18 are preferably formed again, so as to provide the properties as described above for the layers that will be deposited and the superconducting material that has just been deposited. Additional layers can then be formed in the manner described above.

Figure 5:
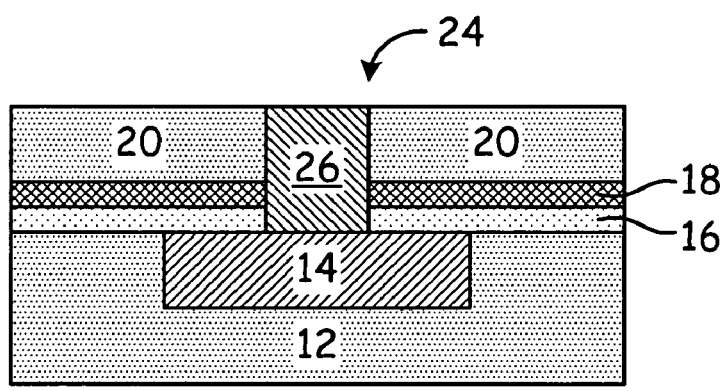
FIG. 5 is a cross sectional view of a portion of an integrated circuit depicting a trench for a via according to an alternate embodiment of the invention.
Figure 6:
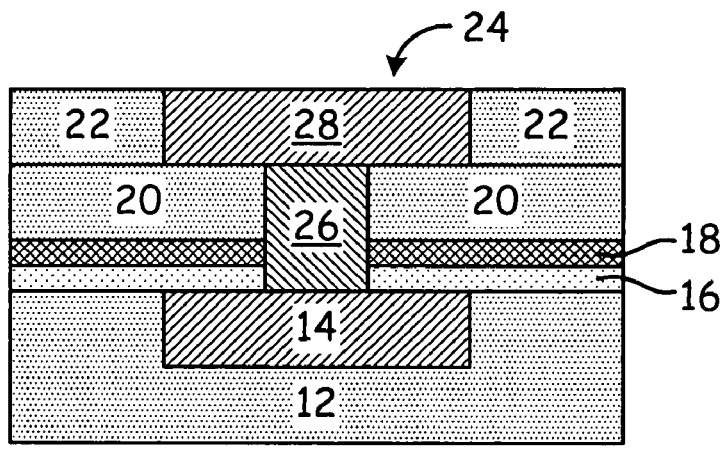
FIG. 6 is a cross sectional view of a portion of the integrated circuit of FIG. 5, where a trench for an interconnect has been formed.

FIG. 5 depicts the alternate embodiment where the via portion 26 of the trench 24 is formed and filled, before the trough portion 28 of the trench 24 is formed and filled, as depicted in FIG. 6. As discussed above, the non electrically conductive materials 12, 20, and 22 are preferably formed of silicon oxide. In this alternate embodiment, the much smaller vias can be formed of a traditional metallization, if so desired, while the interconnects in the trough portion 28 are formed of the superconducting material. However, both portions 26 and 28 are preferably formed of the superconducting material.

Traditional liner and barrier materials as are known in the art can also be used in conjunction with the methods, materials, and processes described above. However, some such will no longer have any utility in combination with the superconducting materials described, whereas other layers, such as the etch stop 16, have properties that are newly desirable with the superconducting materials.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In a method of fabricating an integrated circuit, the improvement comprising the sequential steps of:
    forming an interconductor dielectric layer,
    forming a trench in the interconductor dielectric layer, and
    forming an electrically conductive interconnect of a superconducting material in at least a portion of the trench, wherein the superconducting material is one that superconducts at a temperature of about seventy-seven degrees Kelvin.

2. The method of claim 1, wherein the improvement is applied to all interconductor dielectric layers.

3. The method of claim 1, wherein the interconductor dielectric layer is formed of silicon oxide.

4. The method of claim 1, wherein the trench is a dual damascene structure having a lower via hole portion and an upper trough portion, where both the via hole portion and the upper trough portion are filled with the superconducting material.

5. The method of claim 1, wherein the trench is formed with a dry etch.

6. The method of claim 1, fUrther comprising forming an etch stop layer prior to forming the interconductor dielectric layer.

7. The method of claim 1, wherein the electrically conductive interconnect is formed by laser ablation, sputtering, MOCYD, sol-gel, metal organic decomposition, doctor-blade, liquid phase epitaxy, and spin coating.

8. The method of claim 1, wherein the superconducting material is at least one of an organic compound such as a potassium doped buckminsterfullerene, a cesium doped buckminsterfullerene, and other carbon containing compounds, a metallic material such as an inter-metallic material like Nb-Ti alloys and other substances formed by alloying metals, and an inorganic compound such as $YBa_2Cu_3O_{7-x}$, $(Pb,Bi)_2Sr_2Ca_2Cu_3O_{10-x}$ and its derivatives, HgBaCaCuO and its derivatives, and Tl—Ba—Ca—Cu—O and its derivatives.

9. In a method of fabricating an integrated circuit, the improvement comprising the sequential steps of:
    forming an interconducter dielectric layer,
    forming a trench in the interconducter dielectric layer, and
    forming an electrically conductive interconnect of a superconducting material in at least a portion of the trench,
    wherein the trench is a dual damascene structure having a lower via hole portion and an upper trough portion, where the via hole portion is filled with a metal that is not a superconducting material and the upper trough portion is filled with the superconducting material.

10. In a method of fabricating an integrated circuit, the improvement comprising the sequential steps of:
    forming an interconducter dielectric layer,
    forming a trench in the interconducter dielectric layer,
    forming an electrically conductive interconnect of a superconducting material in at least a portion of the trench, and
    forming a protective layer over the superconducting interconnect, the protective layer formed of a material having a relatively high and selective wet etch rate in comparison to the interconductor dielectric layer.

11. In a method of fabricating an integrated circuit, the improvement comprising the sequential steps of:
    forming an interconducter dielectric layer,
    forming a trench in the interconducter dielectric layer, and
    forming an electrically conductive interconnect of a superconducting material in at least a portion of the trench,
    wherein the superconducting material is one that superconducts at a temperature of about seventy-seven degrees Kelvin.

12. In a method of fabricating an integrated circuit, the improvement comprising the steps of:
    forming all interconductor dielectric layers of silicon oxide,
    dry etching a dual damascene trench in the interconductor dielectric layers, including a lower via hole portion and an upper trough portion,
    depositing a superconducting material of buckminsterfullerenes in both the via hole portion and the trough portion of the trench, so as to completely fill the trench,
    chemically mechanically polishing the integrated circuit to remove any of the superconducting material that is outside of an upper surface of the trench, and
    forming a protective layer over the superconducting material, the protective layer formed of a material having a relatively high and selective wet etch rate in comparison to the interconductor dielectric layer and the superconducting material.

* * * * *